(12) United States Patent
Weis et al.

(10) Patent No.: US 10,998,672 B2
(45) Date of Patent: May 4, 2021

(54) COMPONENT CARRIER STRUCTURES CONNECTED BY COOPERATING MAGNET STRUCTURES

(71) Applicant: AT&S Austria Technologie & Systemtechnik Aktiengesellschaft, Leoben (AT)

(72) Inventors: Gerald Weis, St. Marein im Mürztal (AT); Thomas Krivec, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/599,429

(22) Filed: Oct. 11, 2019

(65) Prior Publication Data

US 2020/0119490 A1    Apr. 16, 2020

(30) Foreign Application Priority Data

Oct. 12, 2018 (EP) .................................... 18200187

(51) Int. Cl.
*H01R 13/62* (2006.01)
*H01R 12/52* (2011.01)
(Continued)

(52) U.S. Cl.
CPC ......... *H01R 13/6205* (2013.01); *H01R 12/52* (2013.01); *H01R 12/716* (2013.01);
(Continued)

(58) Field of Classification Search
CPC .. H01R 13/6205; H01R 12/52; H01R 12/716; H05K 1/141; H05K 1/144; H05K 3/36
(Continued)

(56) References Cited

U.S. PATENT DOCUMENTS 7,637,747 B2 * 12/2009 Jaatinen ............... A61B 5/0408
439/39
7,963,771 B2 *  6/2011 Kumagai ............... G09B 23/18
434/300
(Continued)

FOREIGN PATENT DOCUMENTS

CN    203577330 U    5/2014
CN    205248530 U    5/2016

OTHER PUBLICATIONS

Extended European Search Report in Application 18200187.5; dated Apr. 23, 2019, pp. 1-8; European Patent Office, Munich, Germany.

*Primary Examiner* — Alexander Gilman
(74) *Attorney, Agent, or Firm* — Robert A. Blaha; Smith Tempel Blaha LLC

(57) ABSTRACT

An electric device which includes a first component carrier structure with a first magnet structure and a first connection structure, and a second component carrier structure with a second magnet structure and a second connection structure. The first magnet structure and the second magnet structure are configured such that upon attaching the first component carrier structure and the second component carrier structure to one another the first connection structure is connected to the second connection structure, holding the first component carrier structure and the second component carrier structure together by an attracting magnetic force between the first magnet structure and the second magnet structure.

12 Claims, 5 Drawing Sheets

(51) Int. Cl.
    *H01R 12/71*          (2011.01)
    *H05K 1/14*           (2006.01)
    *H05K 3/36*           (2006.01)

(52) U.S. Cl.
    CPC ............. *H05K 1/141* (2013.01); *H05K 1/144* (2013.01); *H05K 3/36* (2013.01); *H05K 2201/08* (2013.01)

(58) Field of Classification Search
    USPC .......................................................... 439/39
    See application file for complete search history.

(56) References Cited

U.S. PATENT DOCUMENTS

| | | | | |
|---|---|---|---|---|
| 8,187,006 B2 * | 5/2012 | Rudisill | ................. | H01R 11/30 |
| | | | | 439/39 |
| 8,218,327 B2 * | 7/2012 | Ishizaki | ................. | H05K 3/303 |
| | | | | 361/760 |
| 8,957,751 B2 * | 2/2015 | Fullerton | .............. | H01F 7/0205 |
| | | | | 335/296 |
| 9,118,143 B2 * | 8/2015 | Murtagian | ............. | H01R 43/26 |
| 9,137,935 B2 * | 9/2015 | Morris | ................. | B23K 1/0016 |
| 9,300,081 B2 * | 3/2016 | Rudisill | ............. | H01R 13/6205 |
| 9,391,394 B2 * | 7/2016 | Kockx | ................... | H01R 13/03 |
| 9,647,385 B2 * | 5/2017 | Suh | .................... | H01R 13/6205 |
| 9,685,733 B2 * | 6/2017 | Zhao | .................. | H01R 13/6205 |
| 9,787,022 B2 * | 10/2017 | Wilcox | ............. | H01R 13/6658 |
| 9,954,309 B2 * | 4/2018 | Eid | ....................... | H01R 13/631 |
| 2008/0068816 A1 * | 3/2008 | Han | ....................... | H05K 3/308 |
| | | | | 361/760 |
| 2012/0313236 A1 * | 12/2012 | Wakiyama | ............. | H01L 25/50 |
| | | | | 257/734 |
| 2014/0327155 A1 * | 11/2014 | Kang | .................... | H01L 21/565 |
| | | | | 257/777 |
| 2015/0048520 A1 * | 2/2015 | Skinner | ................... | H01L 23/32 |
| | | | | 257/777 |
| 2015/0093920 A1 * | 4/2015 | Colantuono | ....... | H01R 13/6205 |
| | | | | 439/39 |
| 2015/0277503 A1 * | 10/2015 | Eremenko | ............. | G06F 1/1658 |
| | | | | 361/679.4 |
| 2016/0249478 A1 * | 8/2016 | Wang | ................... | H05K 7/1435 |

\* cited by examiner

COMPONENT CARRIER STRUCTURES CONNECTED BY COOPERATING MAGNET STRUCTURES

TECHNICAL FIELD

Embodiments of the present invention generally relate to a method of manufacturing an electric device and to an electric device.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components, packages or electric devices having several components are being employed, which have a plurality of contacts or connections, with ever smaller spacing between these contacts. At the same time, component carriers shall be mechanically robust and electrically reliable so as to be operable even under harsh conditions. Also, a short connection path in a vertical direction between different components or component carriers is advantageous.

SUMMARY

There may be a need to efficiently connect component carriers.

According to an exemplary embodiment of the invention, an electric device is provided which comprises a first component carrier structure (such as a first component carrier) comprising a first magnet structure and a first connection structure, and a second component carrier structure (such as a second component carrier) comprising a second magnet structure and a second connection structure, wherein the first magnet structure and the second magnet structure are configured for, upon attaching the first component carrier structure and the second component carrier structure to one another so that the first connection structure is connected to the second connection structure, holding the first component carrier structure and the second component carrier structure together by an attracting magnetic force between the first magnet structure and the second magnet structure.

According to another exemplary embodiment of the invention, a method of manufacturing an electric device is provided, wherein the method comprises providing a first component carrier structure with a first magnet structure and a first connection structure, providing a second component carrier structure with a second magnet structure and a second connection structure, and configuring the first magnet structure and the second magnet structure for, upon attaching the first component carrier structure and the second component carrier structure to one another so that the first connection structure is connected to the second connection structure, holding the first component carrier structure and the second component carrier structure together by an attracting magnetic force between the first magnet structure and the second magnet structure.

Overview of Embodiments

In the context of the present application, the term "electric device" may particularly denote any electric member, module or package in which two or more component carrier structures are functionally coupled and electrically connected via magnet structures.

In the context of the present application, the term "component carrier structure" may particularly denote any support structure which is capable of accommodating one or more components thereon and/or therein for providing mechanical support and/or electrical connectivity. In other words, a component carrier structure may be configured as a mechanical and/or electronic and/or optical carrier for components. For instance, a component carrier structure may be a component carrier or part thereof. In particular, a component carrier structure may be one of a printed circuit board, an organic interposer, and an IC (integrated circuit) substrate. A component carrier structure may also be a hybrid board combining different ones of the above-mentioned types of component carriers.

In the context of the present application, the term "magnet structure" may denote in particular any physical body or arrangement of multiple physical bodies having magnetic properties capable of generating an attracting magnetic force with another (in particular cooperating, similar or identical) magnet structure. For instance, the magnet structure may have permanent magnetic properties (for instance may be ferromagnetic or ferrimagnetic) or may have paramagnetic properties. It is also possible that the magnet structure is magnetized triggered by an external signal, for instance may be an electromagnet (such as a coil, through which a current can flow, with a ferrite core) or a magnetic material being magnetizable by an external magnetic field. For instance, the magnet structures may comprise or consist of a 3d magnet (such as iron, nickel, cobalt) or a 4f magnet (such as neodymium, cerium, erbium, europium, gadolinium). The magnet structures may have different geometries, for instance may be round, rectangular, square shaped, triangular, etc. In particular, the side walls of the magnet structures may have a certain roughness to improve the adhesion between electrically insulating material of the component carrier(s) and the magnet structure(s).

In the context of the present application, the term "connection structure" may denote in particular a physical body or an arrangement of multiple physical bodies being capable of forming a connection with another connection structure. Such a connection may be a connection capable of communicating signals and/or power between the connection structures. In particular, such a connection may be an electrically conductive connection for transmitting an electric signal, an optical connection for transmitting an optical signal, etc.

According to an exemplary embodiment of the invention, an electric device is assembled by establishing a connection between connection structures of two component carrier structures by corresponding magnet structures forming part of the component carrier structures to be connected. When the two component carrier structures are mutually spatially approached so that the connection structures to be connected are in a proper relative position (in particular orientation and/or distance) to one another, the magnet structures generate a sufficiently strong attracting magnetic force to promote and establish the connection between the connection structures of the component carrier structures, and for holding the latter together. By taking this measure, it is possible to form an electric device with reversibly connected component carrier structures. With such a connection architecture it may also be rendered dispensable to form a permanent connection between the component carrier structures by soldering or the like which is cumbersome and prone to failure. Thus, a high flexibility can be combined with a high robustness against failure.

In the following, further exemplary embodiments of the method and the electric device will be explained.

In an embodiment, the first component carrier structure comprises a stack comprising at least one electrically insulating layer structure and/or at least one electrically conductive layer structure. Correspondingly, the second component carrier structure may comprise a stack comprising at least one electrically insulating layer structure and/or at least one electrically conductive layer structure. The layer structures of these stacks may be connected by lamination, i.e. the application of heat and/or pressure.

In an embodiment, the first magnet structure is embedded in the first component carrier structure. Correspondingly, the second magnet structure may be embedded in the second component carrier structure. By integrating the respective magnet structure in an interior of the respective component carrier structure, the respective magnet structure may be safely protected against undesired mechanical impact. Thus, the reliability of an obtained electric device may be high. Alternatively, it is also possible to surface mount the first and/or second magnet structure on the respective component carrier structure.

In an embodiment, the first component carrier structure is a carrier board, for instance a motherboard. The second component carrier structure may be a module. The carrier board may be a printed circuit board on which multiple components, modules, packages etc. may be mounted. For instance, the carrier board embodied as motherboard may form part of the computer. The module or package may comprise one or more components (for instance embedded therein and/or surface mounted thereon) and may be easily connected to the first component carrier structure by the magnetic connection.

In an embodiment, the first connection structure is connected to the second connection structure with direct physical contact. In other words, the first connection structure and the second connection structure may contact one another directly without any intermediate medium in between. Consequently, a corresponding electric device may be formed with low effort and in a compact way.

In another embodiment, the electric device comprises a (in particular electrically conductive) connection paste (for instance based on graphene) between the first connection structure and the second connection structure. Such a connection paste may promote a reduction of the electric contact resistance between the connection structures and may therefore improve reliability of the electric device. By such a connection paste the connection area between the connection structures may be increased. Under undesired circumstances, connecting the connection structures without connection paste may form a connection in which only tips of the connection structures are in contact with one another. Such a point connection may be rendered more reliable when adding connection paste which may promote, descriptively speaking, a two-dimensional connection area between the connection structures. When the connection between the connection structures is an electric connection, the connection paste is preferably electrically conductive. When the connection between the connection structures is an optical connection, the connection paste is preferably optically transparent.

In an embodiment, the first connection structure and the second connection structure are configured so as to establish one of an electrically conductive connection, an optical connection, and an ultrasonic transmission connection between the first component carrier structure and the second component carrier structure. When establishing an electrically conductive connection, an electric signal, electric power, etc. may be transported between the component carrier structures via the electrically connected connection structures. In such embodiments, the connection structures themselves may be electrically conductive, for instance may be made of metal (in particular copper). When establishing an optical connection, an optical signal (such as a light beam) may be transported between the component carrier structures via the optically connected connection structures. In such embodiments, the connection structures may comprise light guides (such as a light path). It is also possible that one or both of the connection structures comprises an optical source (such as a light emitting diode) for emitting an optical signal and/or an optical detector (such as a photodiode) for detecting an optical signal. An ultrasonic transmission connection may be a connection by the transmission of ultrasonic sound.

In an embodiment, surfaces of the first connection structure and the second connection structure comprise a copper-nickel-gold surface. It has turned out that a copper-nickel-gold surface provides a proper mechanical connection and therefore ensures a reliable electric coupling between the connection structures.

In an embodiment, at least one of the first component carrier structure and the second component carrier structure comprises at least one component. The at least one component may comprise a surface-mounted component and/or an embedded component. In particular, a first component of the at least one component may be surface-mounted on a main surface of the first component carrier structure facing away from an opposing attachment surface of the first component carrier structure at which the first component carrier structure is attached to the second component carrier structure. Additionally or alternatively, a second component of the at least one component may be surface-mounted on a main surface of the second component carrier structure facing away from an opposing attachment surface of the second component carrier structure at which the second component carrier structure is attached to the first component carrier structure. By taking this measure, the electric device may be configured as a package comprising multiple embedded and/or surface mounted components, or may be configured as a system-in-board.

In an embodiment, the first magnet structure comprises a plurality of first magnetic sub-structures (or magnetic elements), in particular multiple island-shaped magnetic sub-structures arranged in a coplanar fashion (i.e. within one plane). Correspondingly, the second magnet structure may comprise a plurality of second magnetic sub-structures (or magnetic elements), in particular multiple island-shaped magnetic sub-structures arranged in a coplanar fashion. By configuring the respective magnet structure to be composed of multiple magnetic elements, a sufficiently strong magnetic field may be generated by such magnetic elements. Furthermore, when dividing one big magnetic element into multiple smaller magnetic elements, they may be surface mounted and/or embedded in any free area or volume of the respective component carrier structure which allows to manufacture the electric device compact and with a reliably high magnetic connection force. Configuring the respective magnet structure from separate magnetic elements may also allow defining a target orientation between the component carrier structures, in which target orientation the mutual alignment of the component carrier structures is desired, wherein only in this target orientation a sufficiently strong attracting magnetic force is generated to hold the component carrier structures together. By taking this measure, it is possible to prevent any erroneous mutual orientation of the component carrier structures.

In an embodiment, the first component carrier structure and the second component carrier structure are detachable from one another. In other words, the connection between the component carrier structures may be reversible. This increases the flexibility, since the component carrier structures may also be detached from one another. By taking this measure, a set of component carrier structures with magnet structures may be flexibly combined as a sort of construction set.

In an embodiment, a connection between the first component carrier structure and the second component carrier structure is solder-free. Thus, the connection between the component carriers may be established exclusively by the magnetic force. However, alternatively, it is also possible that the attracting magnetic force is supported by an additional permanent connection between the component carrier structures, for instance established by soldering.

In an embodiment, at least one of the first magnet structure and the second magnet structure is embedded in a respective cavity in a surface portion of the respective component carrier structure so that the respective magnet structure is exposed to an environment of the respective component carrier structure, in particular in such a manner that the first and second magnet structures of the first and second component carrier structures are in contact with one another. For instance, the respective magnet structure may be embedded in one or more cavities formed in a surface of the respective component carrier structure. This mechanically protects the magnet structures while establishing a very high magnetic force as a result of the small mutual distance. As known by a person skilled in the art, the value of a magnetic force between two magnets depends on the distance between the magnets. By the described embodiment, a high attracting magnetic force may thus be formed, which results in a high reliability of the connection between the component carrier structures.

More generally, any of the magnet structures (or magnetic elements thereof) may be inserted into an open cavity (i.e. a cavity which is open on its top side, in particular so that the magnet structure may be aligned with an exterior surface of the respective component carrier structure) or closed cavity (in particular so that the magnet structure is fully embedded within the respective component carrier structure, in particular so that the magnetic material is enclosed from all sides by laminate material) in the respective component carrier structure.

In an embodiment, the electric device is configured so that, during operation of the electric device, an electric signal is conducted between and through the first magnet structure and the second magnet structure. In such an embodiment, the magnet structures are not only used for establishing a connection force between the component carrier structures, but may be simultaneously used also for conducting an electric signal. In such an embodiment, the magnet structures should be made of an electrically conductive material, for instance iron, nickel or cobalt.

In an embodiment, a protruding portion of the first magnet structure protrudes beyond a layer stack of the first component carrier structure and a recess is formed between the second magnet structure and a layer stack of the second component carrier structure so that, upon attaching the first component carrier structure to the second component carrier structure, the protruding portion of the first magnet structure extends into the recess. When a protruding portion of one of the magnet structures of one of the component carrier structures extends into a recess of the other one of the component carrier structures (wherein the recess may be preferably delimited at least partially by the respectively other magnet structure), the attracting magnetic force may be supported by a form closure between the protruding portion and the recess. Thus, the mechanical reliability of the electric device may be further improved.

In an embodiment, at least one of the first component carrier structure and the second component carrier structure comprises a mechanical fastening element configured for fastening a respective one of the first magnet structure and the second magnet structure to a respective one of the first component carrier structure and the second component carrier structure. For example, such a mechanical fastening element may be a screw, a nail, a rivet or a bolt. The mechanical fastening element may be inserted into the component carrier structure so as to extend into the respective magnet structure for establishing a proper fastening.

In an embodiment, the first magnet structure and the second magnet structure are configured so that the first component carrier structure and the second component carrier structure are connected by an attracting force between the first magnet structure and the second magnet structure only when a mutual orientation between the first component carrier structure and the second component carrier structure corresponds to a target orientation. In particular, when the mutual orientation between the first component carrier structure and the second component carrier structure does not correspond to the target orientation, the first magnet structure and the second magnet structure may generate a repelling magnetic force. By taking this measure, it may be ensured that the component carrier structures being connected to one another by the magnetic force of the magnet structures are in a desired mutual orientation with respect to one another. If the component carrier structures to be connected are not in the desired target orientation, a connection by the magnet structures will be disabled, since the magnetic force will then be repellent rather than attractive. Only when the component carrier structures are in a mutual target orientation, the magnet structures will exert a sufficiently strong mutual attracting magnetic force of such a strength that the connection between the component carrier structures may be established and the component carrier structures may be held together by the magnetic force.

In an embodiment, the first magnet structure and the first connection structure are formed as separate components. Alternatively or additionally, the second magnet structure and the second connection structure are formed as separate components. This may provide the advantage that the connection between two component carrier structures can be realized in an efficient and flexible manner. For example, the first connection structure may be formed as a physical (in particular electrically conductive) contact at a surface of the first component carrier structure and the second connection structure may be formed as a physical (in particular electrically conductive) contact at a surface of the second component carrier structure. In this manner, the two connection structures of the two component carrier structures may connect the two component carrier structures via a direct physical contact (in particular electrically). Furthermore, the first magnet structure may be (at least partially) embedded in the first component carrier structure and the second magnet structure may be (at least partially) embedded in the second component carrier structure. In this manner, the two (embedded) magnet structures of the two different component carrier structures may connect the two component carriers via magnetic force only and not via a direct physical contact. In this described embodiment there may be established an electric contact between the two component carrier structures without a direct mechanical connection. Thereby, the connection of two component carrier structures may be realized in an especially flexible and efficient manner.

In an embodiment, the electronic device comprises a first electromagnetic radiation shielding structure, in particular a shielding cage, that is arranged at least partially around the first magnet structure. Additionally or alternatively, the electronic device comprises a second electromagnetic radiation shielding structure that is arranged at least partially around the second magnet structure. This may provide the advantage that electromagnetic radiation from the magnet structure(s) is efficiently shielded and thereby the functionality of the component carrier structure(s) is improved. The term "shielding structure" may particularly denote an electrically conductive structure polydirectionally enclosing at least a (substantial) part of the magnet structure(s) and being capable of shielding electromagnetic waves from propagating from the magnet structure, thereby efficiently suppressing electromagnetic interference (EMI) with other electronic components (of the component carrier structures). In particular, such a shielding structure may form a sort of Faraday cage preventing electromagnetic radiation from penetrating into undesired areas. Hence, the material of the shielding structure may be such and its geometric arrangement should be of such kind that it efficiently inhibits electromagnetic interference (for in-stance one or more copper foils).

In another embodiment, the first magnet structure and/or the second magnet structure is configured to shield or amplify electromagnetic radiation. This may provide the advantage that electromagnetic radiation from other sources (e.g. electronic components) than the magnet structures can be efficiently shielded (or amplified) to thereby improve specific functionalities of the component carrier structure(s), in particular their electronic components.

In an embodiment, the electronic device comprises a separation structure configured to separate the first component carrier structure and the second component carrier structure (which are hold together by the magnetic force) upon (detecting) a separation event. This may provide the advantage that a multitude of versatile applications can be realized. In the present document, the term "separation structure" may refer to any structure or device that is suitable to separate two component carrier structures which are connected to each other via a magnetic force. In other words, the separation structure may provide a force to the electronic device that overcomes the magnetic force of the magnetic structures. In the present document, the term "separation event" may refer to any event that triggers a separation of the component carrier structures by the separation device, e.g. an emergency, or a theft. In an example, the separation structure may be configured as a wire or a string that connects to at least one of the component carriers to a power machine, e.g. an engine. In another example, the separation structure may be configured as a further magnet structure which has a magnetic force that is stronger than the magnetic force of the first magnet structure and/or the second magnet structure. An exemplary application would be an emergency stop switch that could be activated in case of an emergency (separation event) in order to separate the component carrier structures by the separation structure and thereby interrupt an electric connection between the connecting structures.

Another exemplary embodiment would be an anti-theft application, wherein an alert would be activated, when it is detected that one component carrier structure is separated from the other component carrier structure. Hereby, the separation structure may serve as the detection mechanism and the theft itself would be the separation event.

In an embodiment, the method comprises integrating at least one release layer in a stack comprising at least one electrically insulating layer structure and/or at least one electrically conductive layer structure of at least one of the first component carrier structure and the second component carrier structure, removing a piece of material of the stack of at least one of the first component carrier structure and the second component carrier structure above the release layer to thereby form a cavity, and placing at least one of the first magnet structure and the second magnet structure of at least one of the first component carrier structure and the second component carrier structure in the cavity. The release layer may be made of a material (such as a waxy material, polytetrafluoroethylene, etc.) showing poor adhesion to adjacent material of the stack. When a piece of material above this release layer is circumferentially cut out (in particular by a laser beam), the piece may be simply taken out so that a cavity is formed. The respective magnet structure or magnetic elements thereof may then be simply inserted into the cavity. Alternatively, such a cavity may be formed by milling, etching or laser ablation.

In an embodiment, the method comprises establishing a signal communication connection (in particular an electric connection) between the first component carrier structure and the second component carrier structure by pressing together a first (in particular electrically conductive) connection structure of the first component carrier structure and a second (in particular electrically conductive) connection structure of the second component carrier structure. Thereby, a direct or indirect physical contact may be formed between the connection structures for establishing a reliable connection maintained by the attracting magnetic force of the magnet structures. This connection may be a signal communication connection according to which a signal may be transmitted between the component carrier structures by the connection structures.

In an embodiment, the electric device is configured so that the first magnet structure and the second magnet structure generate an attracting magnetic force, when the component carrier structures are attached to one another, which magnetic force exceeds a summed weight of the component carrier structures. In such an embodiment, it can be safely prevented that the component carrier structures are separated in an undesired way by a small separation force exerted by the own weight of the electric device or by an external impact.

In an embodiment, a respective one of the component carrier structures comprises a stack of at least one electrically insulating layer structure and at least one electrically conductive layer structure. For example, the component carrier structures may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, a respective one of the component carrier structures is shaped as a plate. This contributes to the compact design, wherein the component carrier structures nevertheless provide a large basis for mounting components thereon. Furthermore, in particular a naked die as example for an embedded electronic component, can be conveniently embedded, thanks to its small thickness, into a thin plate such as a printed circuit board.

In an embodiment, a respective one of the component carrier structures is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. Components may be connected to the respective main surface by soldering. A dielectric part of a PCB may be composed of resin with reinforcing fibers (such as glass fibers).

In the context of the present application, the term "substrate" may particularly denote a small component carrier or component carrier structure having substantially the same size as a component (in particular an electronic component) to be mounted thereon. The substrate may comprise or consist of insulating material or a core. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

A substrate or interposer may comprise or consist of at least a layer of glass, silicon, ceramic and/or organic material (like resin). A substrate or interposer may also comprise a photo-imageable or dry-etchable organic material like epoxy-based Build-Up films or polymer compounds like Polyimide, Polybenzoxazole, or Benzocyclobutene.

In an embodiment, the at least one electrically insulating layer structure comprises at least one of the group consisting of resin (such as rein-forced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Reinforcing materials such as webs, fibers or spheres, for example made of glass (multilayer glass) may be used as well. Teflon® is a registered trademark of the Chemours Company FC, LLC of Wilmington, Del., U.S.A. Although prepreg particularly FR4 are usually preferred for rigid PCBs, other materials in particular epoxy-based Build-Up Film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to

DETAILED DESCRIPTION OF ILLUSTRATED EMBODIMENTS

Figure 1:
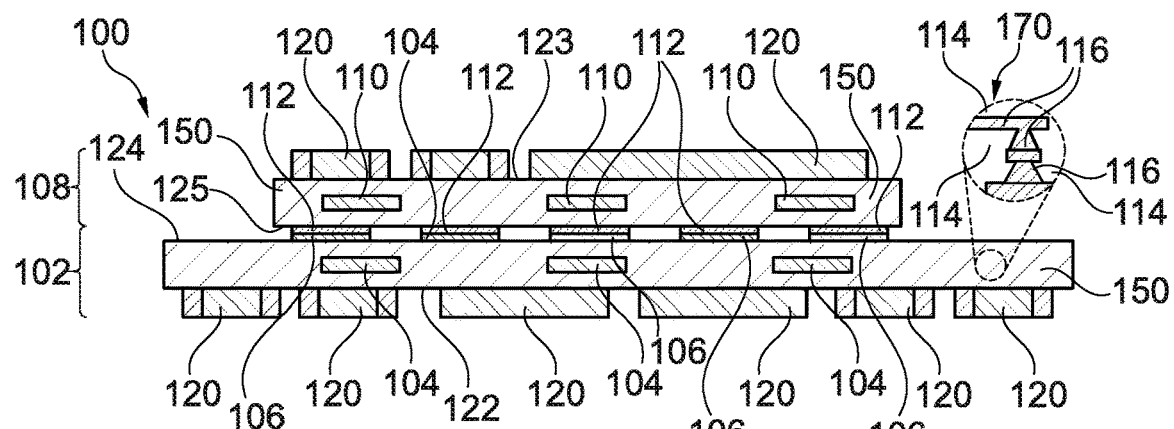
FIG. 1 illustrates a cross-sectional view of an electric device according to an exemplary embodiment of the invention.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

Conventionally, modules are connected by surface mounting or through hole connectors. Drawbacks are the high space requirements and low mechanical stability, in particular in case of high pin count.

According to an exemplary embodiment, an electric device is provided in which a magnetic coupling of component carrier structures (which may also be denoted as electronic modules) is established. In such an embodiment, a connection architecture for coupling electronic modules or component carrier structures is provided in which in particular one printed circuit board (PCB) or other kind of component carrier structures may be arranged above one another connected or held by a magnetic connection or holding force. Advantageously, it turned out that a magnetic force generated by magnet structures of the component carrier structures to be connected is properly able to keep the component carrier structures assembled by an attracting magnetic force. In particular, it has turned out to be possible that a module assembled with light emitting diodes (LEDs) remains in position as expected under the influence of attracting magnetic forces between magnetic elements of two cooperating component carrier structures.

To hold a component carrier structure (such as a module) in place, at least two or more magnets are advantageous. Two, because the component carrier structure can then be also aligned in the correct position during attachment. More generally, one or more magnets may be embedded in a first component carrier structure (such as a module). Furthermore, one or more magnets may be embedded in a second component carrier structure (such as a motherboard or other kind of carrier board). To keep the architecture simple and cost efficient, mechanical deep milling (using a release layer, as described below in further detail) may be applied to form a cavity for preferably self-adhesive magnets.

Depending on the size and/or material of the magnet structures, more or less magnetic force can be applied to keep the component carrier structure in place. The magnetic force can be calculated depending on the weight of the component carrier structure and a force applied in case of a drop test. For instance, the magnetic force of the magnet structures may be configured so that, when the electric device composed of the two component carrier structures drops on a floor from a height of 1 m, it remains properly connected.

Signal transmission between the two connected component carrier structures is simply achieved by pressing two connection structures together, which may preferably be made of Cu—Ni—Au. Such connection structures may be configured as bonding pads. Depending on the copper height and the surface finishing, a solder mask can be applied to protect the component carrier structure (in particular PCB) against environmental influences. The transmitted power is directly related with the size of the formed pads combined with the magnetic force.

In an embodiment, also an embedding of at least one of the magnet structures in the respective component carrier structure is possible, because it simplifies the assembly of one or more components directly above and/or below the magnet structure(s).

Exemplary embodiments of the invention have the advantage that a separate connector is no longer necessary and less space is sufficient to connect different component carrier structures (such as two component carriers) together. Moreover, an easy assembly of different functionality to different carrier boards is possible in exemplary embodiments. Furthermore, a fast and quick replacement of malfunctioned modules becomes possible. It is also possible to flexibly attach component carrier structures with different functionality in a few seconds. It is also possible to quickly replace or change the functionality. Furthermore, it is advantageous that the obtained electric device has a low height and is highly compact. Exemplary embodiments also enable the formation of modular electronics. Exemplary embodiments of the invention can be advantageously used to keep a module (as one of the component carrier structures) on a carrier board (as another one of the component carrier structures) on its position. In an embodiment, it is advantageously possible to accomplish a current transfer through the magnet structures (for instance a power supply). Exemplary embodiments furthermore avoid soldering of component carrier structures (such as modules) and enable a fast change of functionality.

FIG. 1 illustrates a cross-sectional view of an electric device 100 according to an exemplary embodiment of the invention. The electric device 100 is configured as a vertical stack of a plate-shaped laminate-type first component carrier structure 102 and a plate-shaped laminate-type second component structure 108 which are coupled magnetically to one another. For instance, the first component carrier structure 102 may be a motherboard and the second component carrier structure 108 may be a module.

The electric device 100 according to FIG. 1 comprises the first component carrier structure 102 which is configured as a printed circuit board (PCB) and comprises an embedded first magnet structure 104 and a first connection structure 106 located on the surface. The second component carrier structure 108 is also configured as a PCB and comprises an embedded second magnet structure 110 and a second connection structure 112 located on the surface.

As shown in a detail 170, the first component carrier structure 102 comprises a laminated layer stack 150 comprising electrically insulating layer structures 114 and electrically conductive layer structures 116. The electrically insulating layer structures 114 may comprise resin (such as epoxy resin) with reinforcing particles (such as glass fibers or last spheres) therein. The electrically conductive layer structures 116 may comprise patterned copper foils and vertical through connections such as copper filled laser vias. Correspondingly and for instance in a similar way as illustrated in detail 170 for the first component carrier structure 102, the second component carrier structure 108 also comprises a laminated stack 150 comprising electrically insulating layer structures 114 and electrically conductive layer structures 116. The electrically insulating layer structures 114 of the second component carrier structure 108 may comprise resin (such as epoxy resin) with reinforcing particles (such as glass fibers or glass spheres) therein. The electrically conductive layer structures 116 of the second component carrier structure 108 may comprise patterned copper foils and vertical through connections such as copper filled laser vias.

In the shown embodiment, each of the first magnet structure 104 and the second magnet structure 110 comprises a plurality of separate permanent magnetic elements which may comprise or consist of iron. The first magnet structure 104 and the second magnet structure 110 are configured—i.e. in terms of material selection, dimensioning and positioning—for, upon attaching the first component carrier structure 102 and the second component carrier structure 108 to one another so that the first connection structure 106 is connected to the second connection structure 112, holding the first component carrier structure 102 and the second component carrier structure 108 mechanically together by an attracting magnetic force exerted between the first magnet structure 104 and the second magnet structure 110. In other words, the first magnet structure 104 and the second magnet structure 110 are configured and arranged so that they attract each other and with them the component carrier structures 102, 108 when the connection structures 106, 112 are brought in physical contact with one another.

In the embodiment of FIG. 1, the first magnet structure 104 is embedded in an interior of the first component carrier structure 102. Correspondingly, the second magnet structure 110 is embedded in an interior of the second component carrier structure 108. As can be taken from FIG. 1 as well, the first magnet structure 104 comprises a plurality of island-shaped magnetic sub-structures arranged in a coplanar fashion, more specifically within the same horizontal plane. In a corresponding way, the second magnet structure 110 comprises a plurality of island-shaped magnetic sub-structures arranged in a coplanar fashion, more specifically within the same horizontal plane and in parallel to the magnetic sub-structures of the first magnet structure 104. As shown, the magnetic sub-structures of the first magnet structure 104 and the magnetic sub-structures of the second magnet structure 110 are arranged vertically aligned with one another and parallel to one another.

In view of the purely magnetic coupling between the first component carrier structure 102 and the second component carrier structure 108, the first component carrier structure 102 and the second component carrier structure 108 are detachable from one another. Thus, the component carrier structures 102, 108 can be reversibly attached to one another or detached from another as a result of the purely magnetic connection force. Hence, a connection between the first component carrier structure 102 and the second component carrier structure 108 may be solder-free in the shown embodiment. Alternatively, it is possible that the magnetic coupling between the component carrier structures 102, 108 may be strengthened by an additional solder connection.

The connection structures 106, 112 may comprise an electrically conductive material such as copper and may establish an electric connection when being brought in mechanical connection. Moreover, the first connection structure 106 and the second connection structure 112 are configured so as to establish an electrically conductive connection between the first component carrier structure 102 and the second component carrier structure 108. In FIG. 1, the first connection structure 106 is connected to the second connection structure 112 with direct physical contact. Surfaces of the first connection structure 106 and the second connection structure 112 may comprise a copper-nickel-gold surface. This may ensure a proper connection and electric coupling without solder material in between. As a result, an electric connection between the first component carrier structure 102 and the second component carrier structure 108 can be established merely by pressing together the first electrically conductive connection structure 106 of the first component carrier structure 102 and the second electrically conductive connection structure 112 of the second component carrier structure 108.

As shown in FIG. 1, each of the first component carrier structure 102 and the second component carrier structure 108 comprises multiple surface-mounted components 120. Although not shown in FIG. 1, the first component carrier structure 102 and/or the second component carrier structure 108 may, additionally or alternatively, comprise one or more embedded components 120. Some of the components 120 shown in FIG. 1 are surface-mounted on a main surface 122 of the first component carrier structure 102 facing away from an opposing attachment surface 124 of the first component carrier structure 102 at which the first component carrier structure 102 is attached to the second component carrier structure 108. Correspondingly, the remaining components 120 are surface-mounted on a main surface 123 of the second component carrier structure 108 facing away from an opposing attachment surface 125 of the second component carrier structure 108 at which the second component carrier structure 108 is attached to the attachment surface 124 of the first component carrier structure 102.

Furthermore, it is optionally possible to accomplish a current transfer through the magnet structures 104, 110 when formed of electrically conductive material. Such an embodiment is described in further detail referring to FIG. 8.

With the described electric device 100, a vertically highly compact configuration may be obtained with very short connection paths along the vertical (or z-) axis. At the same time, a reliable electric connection can be established by a merely attracting magnetic force, rendering a solder connection dispensable. This allows also a flexible detachment and reconfiguration of component carrier structure arrangements. With the described architecture it is also possible to keep a module (here denoted as second component carrier structure 108) on a carrier board (here denoted as first component carrier structure) on its position.

Figure 2:
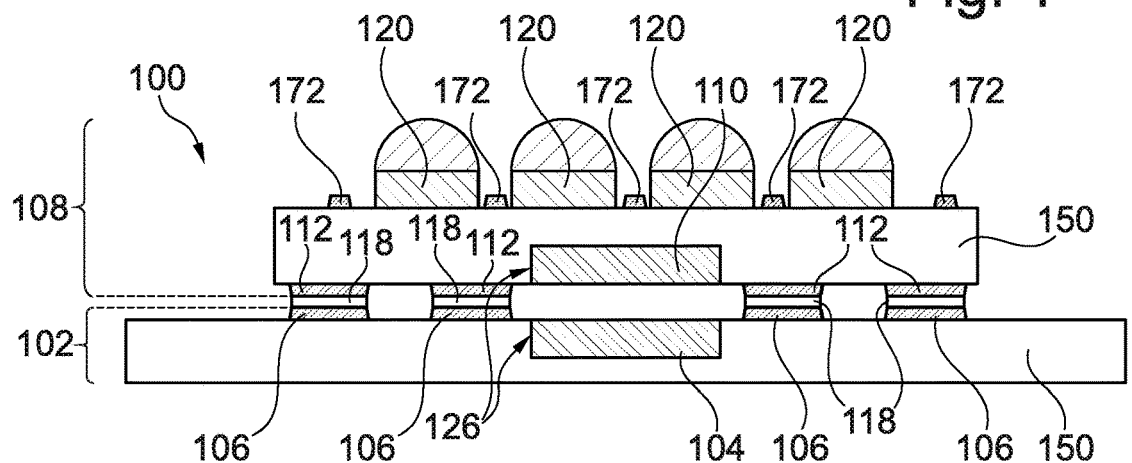
FIG. 2 illustrates a cross-sectional view of an electric device according to another exemplary embodiment of the invention.
Figure 3:
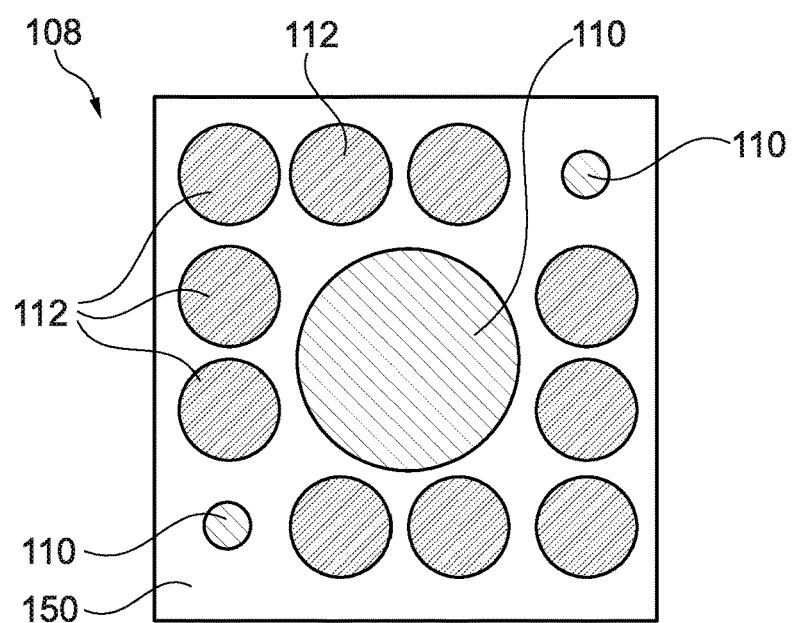
FIG. 3 shows a plan view illustrating a bottom surface of a second component carrier structure of the electric device of FIG. 2.

FIG. 2 illustrates a cross-sectional view of an electric device 100 according to another exemplary embodiment of the invention. FIG. 3 shows a plan view illustrating a bottom surface of second component carrier structure 108 of the electric device 100 of FIG. 2.

Also in the embodiment of FIG. 2, two wiring boards in form of the component carrier structures 102, 108 are held together by a magnetic force. This magnetic force is exerted by the magnet structures 104, 110 embedded in cavities 126 of the respective component carrier structure 102, 108 but having a surface being exposed to the environment. For instance, the magnet structures 104, 110 may be configured as neodymium magnets.

In the embodiment of FIG. 2, an electrically conductive connection paste 118 (which may be manufactured on the basis of graphene) may be provided between the first connection structure 106 and the second connection structure 112 to enhance the connection between the connection structures 106, 112.

As shown in FIG. 2, the second component carrier structure 108, embodied as a module, is placed on the first component carrier structure 102, embodied as a carrier board. Connection structures 106, 112, which are here embodied as copper pads, are covered with a thin layer of electrically conductive connection paste 118 (for instance silver paste and/or copper paste) to promote transmission of electrical energy from the first component carrier structure 102 to the second component carrier structure 108. The connection structures 106, 112 may also form signal pads. Furthermore, in view of the mutual arrangement of the first and second magnet structures 104, 110, it can be ensured that the second component carrier structure 108 stays in position only if it is correctly aligned and on the correct dock platform, i.e. the first component carrier structure 102. For example, such an alignment may be present in each of the embodiments described herein. The surface mounted components 120 are here embodied as surface mounted light-emitting diodes (LEDs) forming a light-emitting diode matrix on an upper main surface of the second component carrier structure 108. For instance, the light-emitting diodes can be dimmable by a pushbutton and/or a USB interface from a computer.

Measurement pads 172 are provided on the upper main surface of the second component carrier structure 108 as well.

As can be taken from the plan view of FIG. 3, the second magnet structure 110 comprises an array of three magnetic elements, one larger central one and two exterior smaller ones. This asymmetric array of an appropriate number of (here three, wherein other numbers are of course possible as well) separate magnetic elements of the second magnet structure 110 (and correspondingly, although not shown, of the first magnet structure 104) ensures that the component carrier structures 102, 108 can only be connected magnetically with a sufficiently high holding force in the scenario of a correct orientation of the component carrier structures 102, 108 relative to one another in which the exterior magnetic elements also contribute to an attracting magnetic force.

For holding for example nine diodes as surface mounted components 120, the module-type second component carrier structure 108 may use ten connection pads (nine for diodes anodes and one for a common cathode) so that the diodes are individually controllable. Consequently, ten pads are provided as second connection structure 112.

Figure 4:
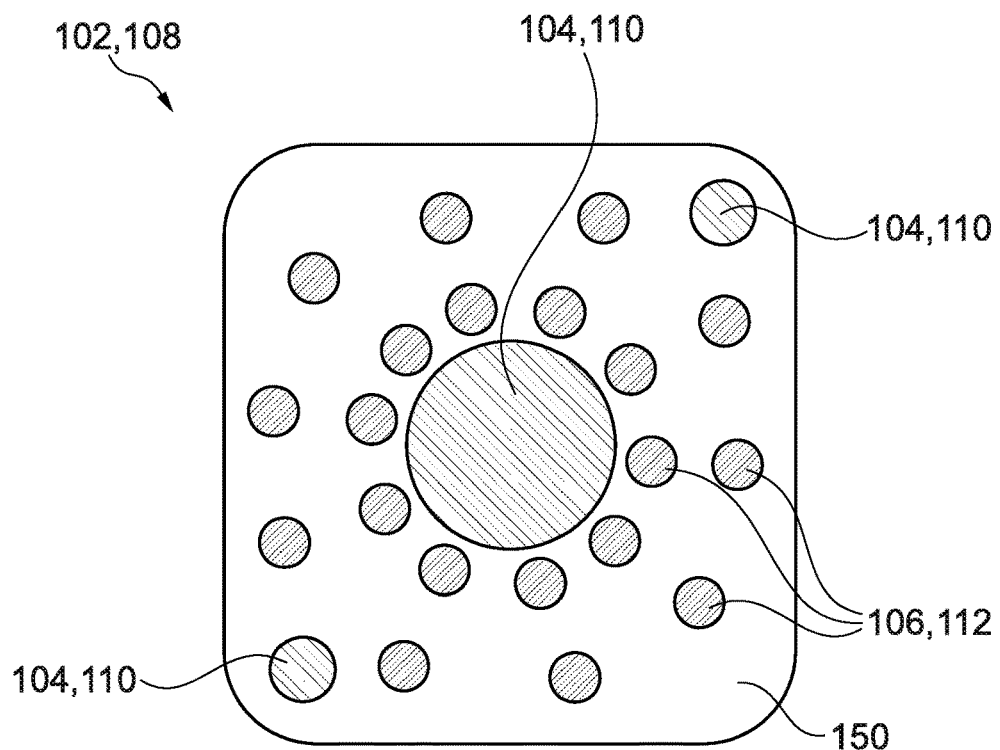
FIG. 4 and FIG. 5 illustrate plan views of a component carrier structure of an electric device according to an exemplary embodiment of the invention.
Figure 5:
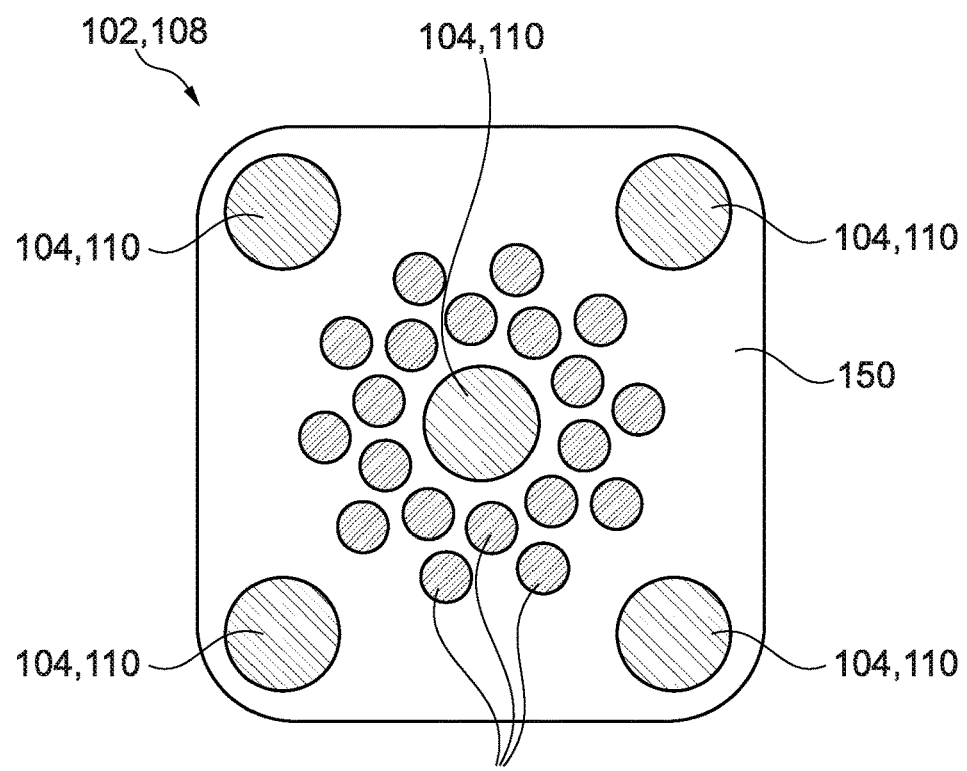

FIG. 4 and FIG. 5 illustrate plan views of a component carrier structure (for instance component carrier structure 102 or component carrier structure 108) of an electric device 100 according to an exemplary embodiment of the invention. To illustrate that the shown configuration can be implemented for the first component carrier structure 102 and/or for the second component carrier structure 108, corresponding reference numerals are shown in each of FIG. 4 and FIG. 5. The embodiments of FIG. 4 and FIG. 5 will however be described for the example of the module-type second component carrier structure 108.

Referring to FIG. 4, the shown component carrier structure 108 has been configured so that the minimum magnetic force was estimated to be about three times stronger than the weight of the module including all its constituents. As shown in FIG. 4, the center magnet of magnet structure 110 has a diameter of 10 mm to exert a high magnetic force to keep the module in position, even in case of a drop. Additional exterior magnets of second magnet structure 110 in two opposing corners of the module with a diameter of 1 mm may be used to align the module in the correct position.

The carrier board or first component carrier structure 102 may have the same or a similar configuration which may be connected to the electronics to control the LEDs as desired. An electronic hardware including a microcontroller with USB connection and an LED pulse width modulation (PWM) driver may be installed on this board to control all the light emitting diodes.

Referring to FIG. 5, another embodiment similar to that of FIG. 4 is shown which involves a further improvement in terms of current transmission capability and holding force reliability. The embodiment of FIG. 5 provides a further increased magnetic force to reliably keep the module or second component carrier structure 108 in place. This embodiment may provide an attracting magnetic force about 14 times stronger than the module's weight.

Since the module-type second component carrier structure 108 of FIG. 5 is different from that of FIG. 4, also the carrier board-type first component carrier structure 102 may be provided with a correspondingly adapted layout as docking station for the module. With the shown configuration, the holding force is strong enough to keep the module in place (also in case of a drop test from a height of 1 m).

In order to efficiently suppress warpage, a copper height of 35 μm for the connection structures 106, 112 with chemical Ni/Au surface is used in combination with a layer of electrically conductive silver paste (see reference numeral 118 in FIG. 2) which may be printed on the pads of one or both of the connection structures 106, 112 to ensure a proper connection.

Figure 6:
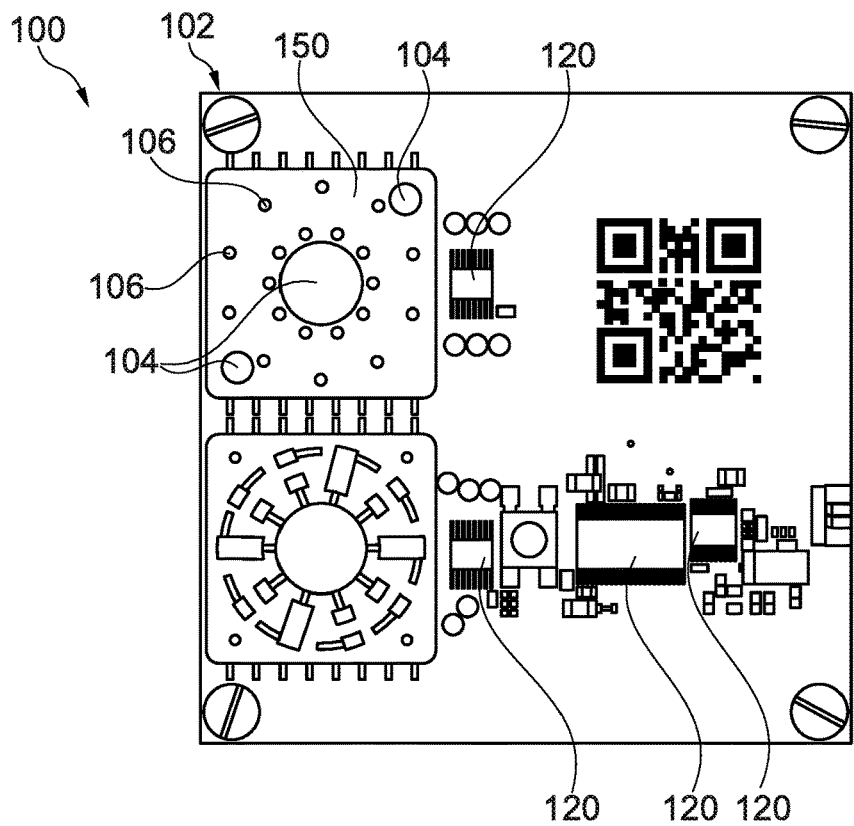
FIG. 6 and FIG. 7 illustrate plan views of parts of electric devices according to exemplary embodiments of the invention.
Figure 7:
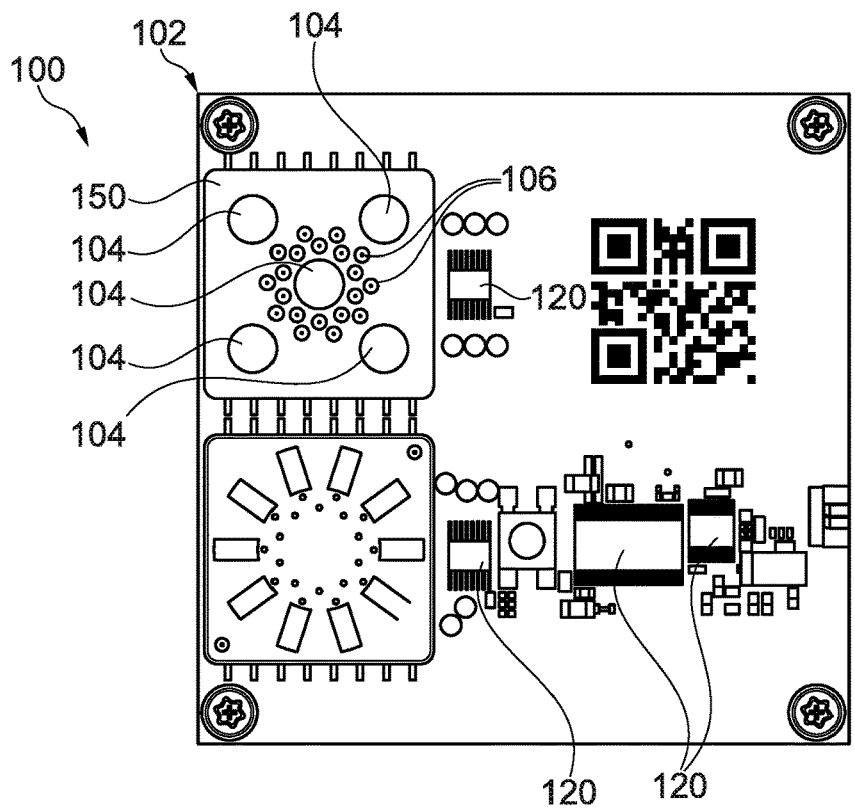

FIG. 6 and FIG. 7 illustrate plan views of parts of electric devices 100 according to exemplary embodiments of the invention. The first component carrier structure 102 shown in FIG. 6 generally corresponds to the second component carrier structure 108 shown in FIG. 4. The first component carrier structure 102 shown in FIG. 7 corresponds to the second component carrier structure 108 shown in FIG. 5.

FIG. 8 to FIG. 11 illustrate cross-sectional views of electric devices 100 according to exemplary embodiments of the invention.

Figure 8:
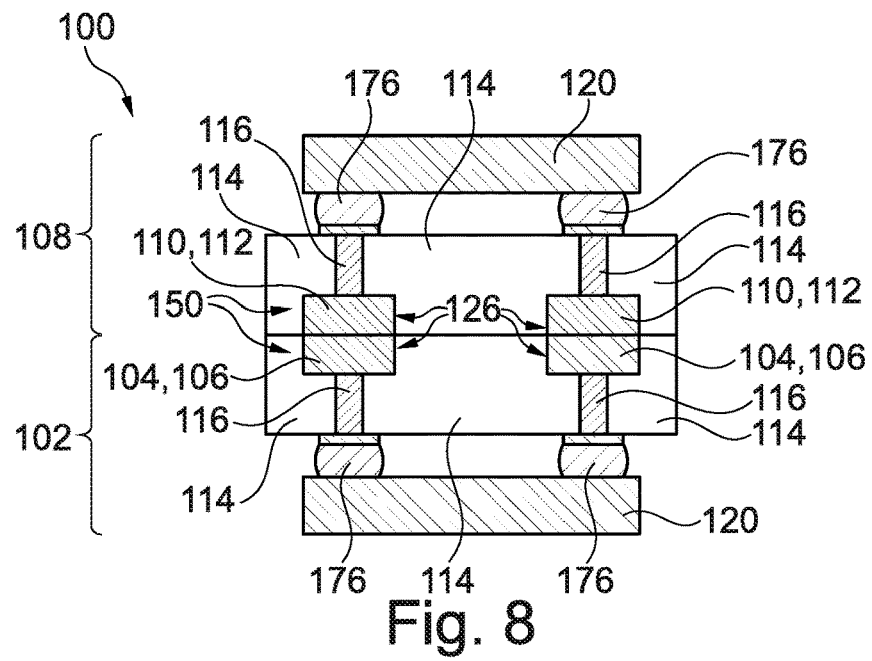
FIG. 8, FIG. 9, FIG. 10 and FIG. 11 illustrate cross-sectional views of electric devices according to exemplary embodiments of the invention.

Referring to FIG. 8, magnetic elements of the first magnet structure 104 are embedded in cavities 126 in a surface portion of the first component carrier structure 102. Correspondingly, magnetic elements of the second magnet structure 110 are embedded in cavities 126 in a surface portion of the second component carrier structure 108. This embedding is accomplished in such a way that the magnetic elements extends up to the respective exterior main surface of the respective component carrier structure 102, 108. As a result, the magnet structures 104, 110 are exposed to an environment of the respective component carrier structure 102, 108 in such a manner that the first and magnet structures 104, 110 of the first and second component carrier structures 102, 108 are in direct physical contact with one another (or optionally separated only by electrically conductive conduction paste 118). By taking this measure, it can be ensured that the attracting magnetic force between the magnetic elements of the first and second magnet structures 104, 110 (which depends on the distance) is sufficiently high to guarantee a proper holding force even under harsh conditions such as a drop.

Furthermore, the electric device 100 is configured so that, during operation of the electric device 100, an electric signal can be conducted between and through the first magnet structure 104 and the second magnet structure 110. For this purpose, the electrically conductive material of the magnet elements of the magnet structures 104, 110 is connected to surface mounted components 120 of the component carrier structures 102, 108 via electrically conductive vertical through connections of the electrically conductive layer structures 116 of the stack 150 of the component carrier structures 102, 108. The surface mounted components 120 are soldered, via solder structures 176, onto the respective main surface of the respective component carrier structure 102, 108.

In the shown embodiment, the first magnet structure 104 is identical to and synergetically functions as the first connection structure 106, and the second magnet structure 110 is identical to and synergetically functions as the second connection structure 112.

Figure 9:
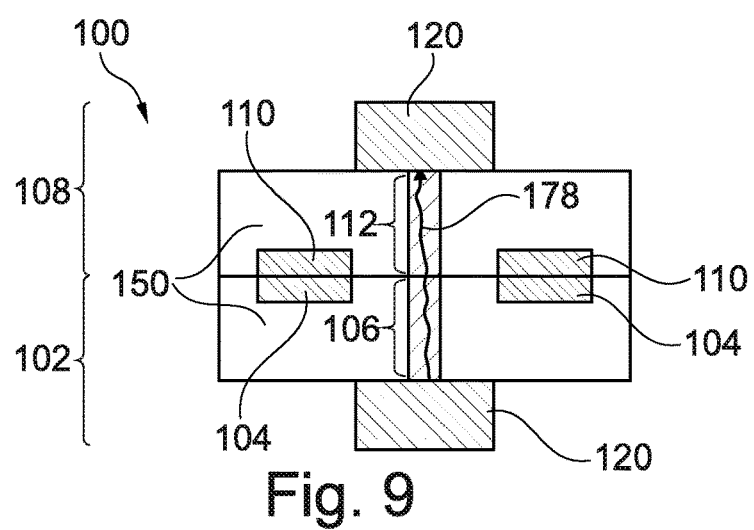

Referring to FIG. 9, the first connection structure 106 and the second connection structure 112 are configured so as to establish an optical connection between the first component carrier structure 102 and the second component carrier structure 108. For this purpose, the first connection structure 106 is configured as a first light guide (for instance an optical path) embedded in the stack 150 of the first component carrier structure 102 and extending up to the connection surface of the first component carrier structure 102 (and in the shown embodiment extending also up to a surface mounted component 120 of the first component carrier structure 102). Correspondingly, the second connection structure 112 is configured as a second light guide (for instance an optical path) embedded in the stack 150 of the second component carrier structure 108 and extending up to the connection surface of the second component carrier structure 108 (and in the shown embodiment extending also up to a surface mounted component 120 of the second component carrier structure 108). One or more light-emitting diodes and/or one or more photocouplers may be provided as well in the electric device. The component carrier structures 102, 108 are connected to one another at their connection surfaces. Thus, a continuous optical path is formed extending through the entire vertical thickness of the component carrier structures 102, 108 as a result of the aligned light guides. Consequently, a light beam 178 may propagate through the entire component carrier structures 102, 108, for instance from component 120 on the bottom (for instance a light source such as a light emitting diode) up to the component 120 on the top of the electric device 100 (for instance a light detector such as a photodiode).

Figure 10:
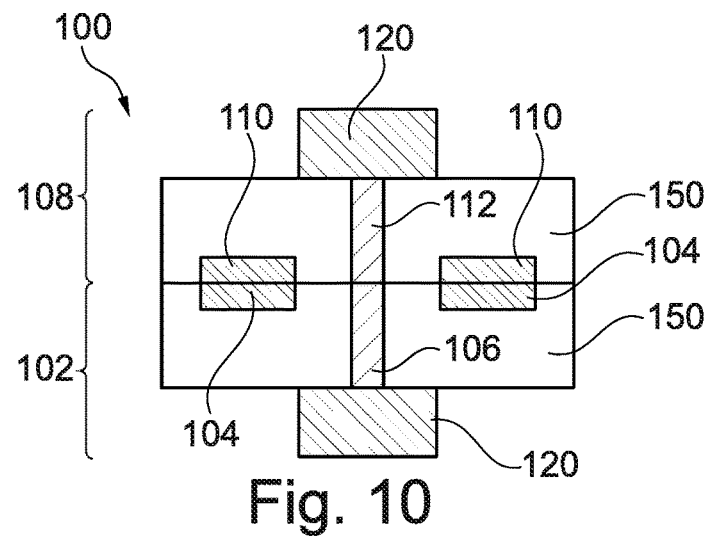

Referring to FIG. 10, yet another embodiment is shown which differs from the embodiment of FIG. 9 in that the connection structures 106, 112 are now configured as electrically conductive structures (for instance copper structures) enabling an electric coupling between the components 120 on the two opposing main surfaces of the component carrier structures 102, 108. While the embodiment of FIG. 9 supports an optoelectronic communication, the embodiment of FIG. 10 supports an electric communication.

Figure 11:
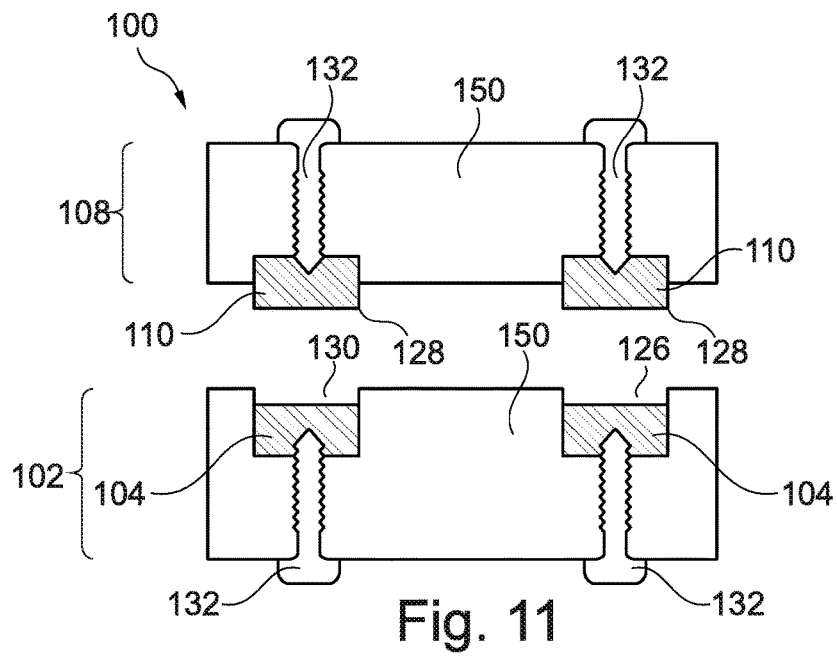

FIG. 11 shows an electric device 110 prior to connection of the assigned component carrier structures 102, 108. According to FIG. 11, a protruding portion 128 of the second magnet structure 110 protrudes beyond a layer stack 150 of the second component carrier structure 108. Furthermore, a recess 130 is formed between the first magnet structure 104 and a layer stack 150 of the first component carrier structure 102. Descriptively speaking, reference numeral 126 denotes the whole cavity 126, whereas the recess 130 relates only to the part of the cavity 126 remaining after placing the first magnet structure 104 in the cavity 126, when the first magnet structure 104 has a smaller height then the depth of the cavity 126. In other words, the recess 130 may also be denoted as a cavity portion remaining empty after placing the first magnetic structure 104 in the cavity 126. As a result of the complementary configuration of protruding portion 128 and recess 130, upon attaching the first component carrier structure 102 to the second component carrier structure 108, the protruding portion 128 extends into the recess 130. Thus, the connection between the component carrier structures 102, 108 can be further improved according to FIG. 11, since the attracting magnetic force between the magnet structures 104, 110 exerted in vertical direction according to FIG. 11 is additionally supported by a horizontal fixing by the form closure between the protruding portion 128 and the recess 130. The connection of the component carrier structures 102, 108 is therefore even more reliable.

In the embodiment of FIG. 11, the first component carrier structure 102 and the second component carrier structure 108 each comprise an assigned mechanical fastening element 132 (here embodied as screws) configured for fastening the first magnet structure 104 and the second magnet structure 110 to a respective one of the first component carrier structure 102 and the second component carrier structure 108.

Figure 12:
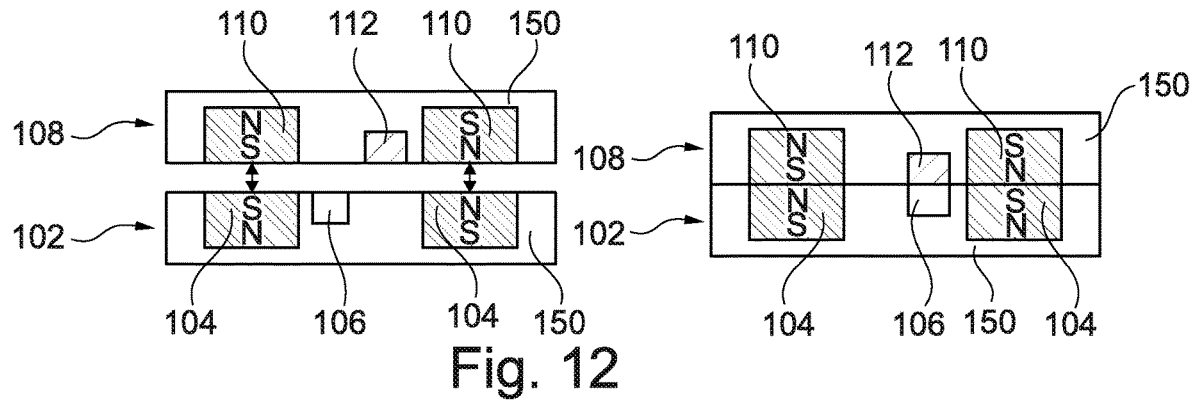
FIG. 12 illustrates component carrier structures of an electric device according to an exemplary embodiment of the invention in a connection disabling orientation (left-hand side) and in a connection enabling orientation (right-hand side).

FIG. 12 illustrates component carrier structures 102, 108 of an electric device 100 according to an exemplary embodiment of the invention in a connection disabling orientation (left-hand side) and in a connection enabling orientation (right-hand side).

In the described embodiment, the first magnet structure 104 and the second magnet structure 110 are configured so that the first component carrier structure 102 and the second component carrier structure 108 are connected by an attracting force between the first magnet structure 104 and the second magnet structure 110 only when a mutual orientation between the first component carrier structure 102 and the second component carrier structure 108 corresponds to a target orientation. This scenario is shown in FIG. 12 on the right-hand side.

However, if the mutual orientation between the first component carrier structure 102 and the second component carrier structure 108 does not correspond to the target orientation, the first magnet structure 104 and the second magnet structure 110 generate a repellent magnetic force. This scenario is shown in FIG. 12 on the left-hand side.

In FIG. 12, "N" denotes a magnetic north pole while "S" denotes a magnetic south pole. As known by a person skilled in the art, a magnetic north pole of one magnetic element and a magnetic south pole of another magnetic element attract each other as a result of an attracting magnetic force. In contrast to this, a magnetic north pole of one magnetic element and a magnetic north pole of another magnetic element generate a repellent magnetic force. Also, a magnetic south pole of one magnetic element and a magnetic south pole of another magnetic element generate a repellent magnetic force. In the mutual orientation of the component carrier structures 102, 108 as shown on the left-hand side (which corresponds to an undesired or erroneous mutual orientation), the generated repellent magnetic force avoids that the component carrier structures 102, 108 are assembled in the shown erroneous configuration. In contrast to this, in the mutual orientation of the component carrier structures 102, 108 as shown on the right-hand side (which corresponds to a desired or target mutual orientation), the generated attracting magnetic force promotes that the component carrier structures 102, 108 are held together in the shown target configuration. Thus, safety of operation may be increased with the configuration according to FIG. 12.

Figures 13, 14, 15:
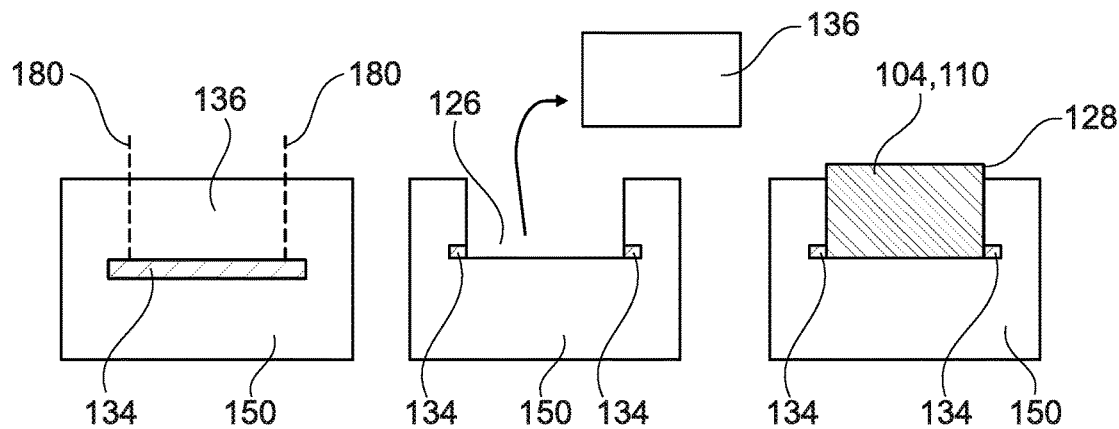
FIG. 13, FIG. 14 and FIG. 15 illustrate cross-sectional views of structures obtained during manufacturing an electric device according to an exemplary embodiment of the invention.

FIG. 13 to FIG. 15 illustrate cross-sectional views of structures obtained during manufacturing an electric device 100 according to an exemplary embodiment of the invention. These cross-sectional views illustrate how a magnet structure 104, 110 may be embedded in a cavity 126 of a respective layer stack 150 of a first or second component carrier structure 102, 108.

Referring to FIG. 13, a release layer 134 is buried in the stack 150 (which may comprise at least one electrically insulating layer structure 114 and/or at least one electrically conductive layer structure 116, compare detail 170 of FIG. 1) of the first component carrier structure 102 or the second component carrier structure 108. Embedding the release layer 134 may be accomplished by laminating the release layer 134 in an interior of the layer structures 114, 116 of stack 150. The material of the release layer 134 (for instance a waxy component) may be selected so as to provide a poor adhesion with respect to surrounding material of the stack 150.

Referring to FIG. 14, a piece 136 of material of the stack 150 above the release layer 134 is removed to thereby form a cavity 126. This can be accomplished by forming a circumferential cut along a cutting line 180 shown in FIG. 13, for instance with a laser beam (not shown). In view of the poor adhesion between the material of the release layer 134 and surrounding material of the stack 150, piece 136 may subsequently simply be taken out from the stack 150. As a result, cavity 126 in stack 150 is obtained. The release layer 134 may be removed thereafter at least partially.

Referring to FIG. 15, the first magnet structure 104 or the second magnet structure 110 it is then inserted and thereby embedded in the cavity 126. Before inserting, it is possible that an adhesive material (not shown) is placed in the cavity 126 to improve adhesion between the stack 150 and the magnet structure 104, 110.

When the height of the respective magnet structure 104, 110 is larger than the height of the cavity 126, a protruding portion 128 is formed. When the height of the respective magnet structure 104, 110 is however smaller than the height of the cavity 126, a recess 130 is formed (compare FIG. 11). It may however be preferred in certain embodiments that the magnet structures 104, 110 are aligned with the respective component carrier structure 102, 108.

It should be noted that the term "comprising" does not exclude other elements or steps and the articles "a" or "an" does not exclude a plurality. Also, elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. An electric device, comprising:
a first component carrier structure comprising a first magnet structure and a first connection structure;
a second component carrier structure comprising a second magnet structure and a second connection structure;
wherein the first magnet structure and the second magnet structure are configured for, upon attaching the first component carrier structure and the second component carrier structure to one another so that the first connection structure is connected to the second connection structure with direct physical contact to one another, holding the first component carrier structure and the second component carrier structure together by an attracting magnetic force between the first magnet structure and the second magnet structure,
wherein at least one of the first magnet structure and the second magnet structure is embedded in a respective cavity in a surface portion of the respective component carrier structure, and
wherein at least one of the first component carrier structure and the second component carrier structure is configured as one of the group consisting of a printed circuit board, and a substrate.

2. The electric device according to claim 1, comprising at least one of the following features:
wherein the first component carrier structure comprises a stack comprising at least one electrically insulating layer structure and/or at least one electrically conductive layer structure;
wherein the second component carrier structure comprises a stack comprising at least one electrically insulating layer structure and/or at least one electrically conductive layer structure;
wherein the first component carrier structure is a carrier board and/or the second component carrier structure is a module;
a connection paste between the first connection structure and the second connection structure;
wherein the first connection structure and the second connection structure are configured so as to establish at least one of an electrically conductive connection, an optical connection, and an ultrasonic transmission connection between the first component carrier structure and the second component carrier structure;
wherein a surface of the first connection structure and/or of the second connection structure comprises a copper-nickel-gold surface.

3. The electric device according to claim 1, wherein at least one of the first component carrier structure and the second component carrier structure comprises at least one component.

4. The electric device according to claim 3, comprising at least one of the following features:
wherein the at least one component is a surface-mounted component and/or an embedded component;
wherein a first component of the at least one component is surface-mounted on a main surface of the first component carrier structure facing away from an opposing attachment surface of the first component carrier structure at which the first component carrier structure is attached to the second component carrier structure, wherein in particular a second component of the at least component is surface-mounted on a main surface of the second component carrier structure facing away from an opposing attachment surface of the second component carrier structure at which the second component carrier structure is attached to the first component carrier structure;

wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a light-emitting diode, a photocoupler, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

5. The electric device according to claim 1, comprising at least one of the following features:

wherein the first magnet structure comprises a plurality of first magnetic sub-structures, in particular multiple island-shaped magnetic sub-structures arranged in a coplanar fashion;

wherein the second magnet structure comprises a plurality of second magnetic sub-structures, in particular multiple island-shaped magnetic sub-structures arranged in a coplanar fashion;

wherein the first component carrier structure and the second component carrier structure are detachable from one another, wherein a connection between the first component carrier structure and the second component carrier structure is solder-free;

wherein at least one of the first magnet structure and the second magnet structure is embedded in a respective cavity in a surface portion of the respective component carrier structure so that the respective magnet structure is exposed to an environment of the respective component carrier structure, in particular in such a manner that the first and second magnet structures of the first and second component carrier structures are in contact with one another.

6. The electric device according to claim 1, configured so that, during operation of the electric device, an electric signal is conducted between the first magnet structure and the second magnet structure.

7. The electric device according to claim 1, wherein a protruding portion of the first magnet structure protrudes beyond a layer stack of the first component carrier structure and a recess is formed between the second magnet structure and a layer stack of the second component carrier structure so that, upon attaching the first component carrier structure to the second component carrier structure, the protruding portion extends into the recess.

8. The electric device according to claim 1, wherein at least one of the first component carrier structure and the second component carrier structure comprises a mechanical fastening element configured for fastening a respective one of the first magnet structure and the second magnet structure to a respective one of the first component carrier structure and the second component carrier structure.

9. The electric device according to claim 1, wherein the first magnet structure and the second magnet structure are configured so that the first component carrier structure and the second component carrier structure are connected by an attracting magnetic force between the first magnet structure and the second magnet structure only when a mutual orientation between the first component carrier structure and the second component carrier structure corresponds to a predefined target orientation.

10. The electric device according to claim 9, wherein, when the mutual orientation between the first component carrier structure and the second component carrier structure does not correspond to the predefined target orientation, the first magnet structure and the second magnet structure generate a repellent magnetic force.

11. The electric device according to claim 1, comprising at least one of the following features:

wherein at least one electrically conductive layer structure of at least one of the first component carrier structure and the second component carrier structure comprises at least one of the group consisting of copper, aluminum, nickel, silver, gold, palladium, and tungsten, any of the mentioned materials being optionally coated with supra-conductive material such as graphene;

wherein at least one electrically insulating layer structure of at least one of the first component carrier structure and the second component carrier structure comprises at least one of the group consisting of resin, in particular reinforced or non-reinforced resin, for instance epoxy resin or Bismaleimide-Triazine resin, FR-4 FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

wherein at least one of the first component carrier structure and the second component carrier structure is shaped as a plate;

wherein at least one of the first component carrier structure and the second component carrier structure is configured as a laminate-type component carrier.

12. The electronic device according to claim 1, wherein the first magnet structure and the first connection structure are formed as separate components; and/or wherein the second magnet structure and the second connection structure are formed as separate components.

* * * * *